United States Patent [19]

Okumura et al.

[11] Patent Number: 4,914,808

[45] Date of Patent: Apr. 10, 1990

[54] AUTOMATIC ELECTRONIC PARTS MOUNTING APPARATUS FOR REPEATEDLY MOUNTING IN FORWARD AND REVERSE SEQUENCES

[75] Inventors: Toshikatsu Okumura, Ohta; Atsushi Kura, Saitama; Yoshio Tanabe, Gunma; Kazuyoshi Ohyama, Tochigi, all of Japan

[73] Assignee: Sanyo Electric Co., Ltd, Osaka, Japan

[21] Appl. No.: 257,959

[22] Filed: Oct. 14, 1988

[30] Foreign Application Priority Data

Oct. 16, 1987 [JP] Japan ................................ 62-262247
Nov. 12, 1987 [JP] Japan ................................ 62-286220

[51] Int. Cl.⁴ ............................................. B23P 19/04
[52] U.S. Cl. ......................................... 29/740; 29/743; 29/759
[58] Field of Search .................. 29/701, 702, 703, 739, 29/740, 741, 759, 771, DIG. 44, 407; 221/3, 6, 71, 74

[56] References Cited

U.S. PATENT DOCUMENTS

| | | | |
|---|---|---|---|
| 4,393,579 | 6/1983 | Van Hooreweder | 29/759 X |
| 4,653,664 | 3/1987 | Hineno et al. | 29/759 X |
| 4,675,993 | 6/1987 | Harada | 29/740 |
| 4,677,258 | 6/1987 | Kawashima et al. | 29/701 X |
| 4,763,405 | 8/1988 | Morita et al. | 29/740 |

Primary Examiner—P. W. Echols
Assistant Examiner—Peter D. B. Vo
Attorney, Agent, or Firm—Darby & Darby

[57] ABSTRACT

The invention discloses that when parts are mounted on a single board in a plurality of identical patterns, parts mounting can be effieciently performed by changing the sequence of mounting the parts for each pattern in accordance with the arrangement state of the pattern, and a blank portion on the board can be minimized and hence patterning can be effectively performed by arbitrarily setting the directions of the mounting patterns to be mounted on the printed board in accordance with its form. In addition, the invention discloses that when chip parts are mounted on a board in a plurality of patterns including identical patterns and independent pattern having no correlation therewith, parts mounting can be easily and collectively performed, and when a plurality of types of parts having different shapes and sizes are mounted on a board together, a group of parts which are less subject to a positional error due to the movement speed of an X-Y table are repeatedly mounted first on the board at a high movement speed, and a group of parts which are subject to a positional error are repeatedly mounted in the same manner at a low movement speed, thereby preventing a positional error due to an inertial force upon high-speed movement of the X-Y table.

9 Claims, 10 Drawing Sheets

FIG. 3

| STEP NO. | MOUNTING POSITION DATA X0000 Y0000 | MOUNTING DIRECTION DATA θ0000 | PARTS DATA | CONTROL COMMAND | |
|---|---|---|---|---|---|
| M001 | X0000   Y0000 | θ0000 | R000 | | ⎫ |
| ---- | ---- | ---- | ---- | | ⎬ MOUNT DATA |
| M123 | X0000   Y0000 | θ0000 | R000 | F | ⎭ |

| STEP NO | EACH PATTERN OFFSET DATA X0000 Y0000 | MOUNTING DIRECTION DATA θ0000 | CONTROL COMMAND | |
|---|---|---|---|---|
| M124 | X0000   Y0000 | θ0000 | P | ⎫ |
| M125 | X0000   Y0000 | θ0000 | Q | ⎬ OFFSET DATA |
| ---- | ---- | ---- | P | |
| M127 | X0000   Y0000 | θ0000 | E | ⎭ |

11

| M001 | X0000 | Y0000 | θ000 | R00 |   |
| M006 | X0000 | Y0000 | θ000 | R00 | F |
| M007 | X0000 | Y0000 | θ000 |     | P |
| M008 | X0000 | Y0000 | θ000 |     | P |
|      |       |       |      |     | E |

| M001 | X0000 | Y0000 | θ000 | R00 |   |
| ---  | ---   | ---   | ---  | --- | - |
| M010 | X0000 | Y0000 | θ000 | R00 | F |
| M011 | X0000 | Y0000 | θ000 |     | P |
| M012 | X0000 | Y0000 | θ000 |     | Q |
|      |       |       |      |     | E |

| | | | | | |
|---|---|---|---|---|---|
| M001 | X0000 | Y0000 | θ000 | R00 | |
| ⋮ | | | | | |
| M006 | X0000 | Y0000 | θ000 | R00 | F |
| M007 | X0000 | Y0000 | θ000 | | P |
| M008 | X0000 | Y0000 | θ000 | | P |
| M009 | X0000 | Y0000 | θ000 | | P |
| M010 | X0000 | Y0000 | θ000 | | Q |
| | | | | | E |

```
M001    X0000   Y0000   θ000    R00

M005    X0000   Y0000   θ000    R00    F
M006    X0000   Y0000   θ000           P
M007    X0000   Y0000   θ000           P
M008    X0000   Y0000   θ000           Q
                                       E
```

| STEP NO. | MOUNTING POSITION DATA | MOUNTING DIRECTION DATA | PARTS DATA | CONTROL COMMAND |
|---|---|---|---|---|
| M001 | X0000  Y0000 | θ000 | R000 | |
| M002 | X0000  Y0000 | θ000 | R000 | |
| M003 | - | - | - | F |
| M004 | - | - | - | P |
| M005 | - | - | - | P |
| M006 | - | - | - | P |
| M007 | - | - | - | P |
| M008 | - | - | - | P |
| M009 | - | - | - | P |
| M010 | - | - | - | P |
| M011 | - | - | - | P |
| M012 | - | - | - | |
| M013 | - | - | - | |
| M014 | - | - | - | |
| M015 | - | - | - | |
| M016 | - | - | - | |
| M017 | - | - | - | |
| M018 | - | - | - | |
| M019 | X0000  Y0000 | θ000 | R000 | |

E

| STEP NO. | MOUNTING POSITION DATA | MOUNTING DIRECTION DATA | PARTS DATA | CONTROL COMMAND |
|---|---|---|---|---|
| M001 | X0000  Y0000 | θ000 | R000 | |
| M002 | X0000  Y0000 | θ000 | R000 | |
| M003 | - | - | - | |
| M004 | - | - | - | 1 |
| M005 | - | - | - | |
| M006 | - | - | - | 2 |
| M007 | - | θ000 | R000 | F/ |
| M008 | - | | | P |
| M009 | - | | | P |
| M010 | - | | | P |
| M011 | X0000  Y0000 | | | P |
| | | | | E |

| STEP NO. | MOUNTING POSITION DATA | | MOUNTING DIRECTION DATA | PARTS DATA | CONTROL COMMAND |
|---|---|---|---|---|---|
| M001 | X0000 | Y0000 | θ000 | R000 | |
| M002 | X0000 | Y0000 | θ000 | R000 | |
| M003 | X0000 | Y0000 | θ000 | R000 | |
| M004 | - | - | - | - | 1 |
| M005 | - | - | - | - | |
| M006 | - | - | - | - | 2 |
| M007 | - | - | - | - | F/ |
| M008 | X0000 | Y0000 | θ000 | R000 | P |
| M009 | X0000 | Y [Y1] | θ000 | R000 | Q |
| M010 | X [X1] | Y0000 | θ090 | R000 | P |
| | | | | | E |

AUTOMATIC ELECTRONIC PARTS MOUNTING APPARATUS FOR REPEATEDLY MOUNTING IN FORWARD AND REVERSE SEQUENCES

BACKGROUND OF THE INVENTION

1. Field of the Invention

The present invention relates to an automatic electronic parts mounting apparatus and, more particularly, to an automatic electronic parts mounting apparatus in which when various chip type electronic parts (to be referred to as chip parts hereinafter), e.g., resistors, capacitors, and transistors are automatically positioned/mounted on a printed board placed on an X-Y table in a plurality of different types of patterns constituted by identical patterns and independent patterns having no correlation therewith chip parts having different shapes and sizes can be selectively positioned/mounted by sorting them in accordance with their forms.

2. Description of the Prior Art

In a conventional automatic electronic parts mounting apparatus of this type, as disclosed in, e.g., U.S. Pat. No. 4,653,664, chip parts having different shapes and sizes are selectively fed from a parts feed means in which they are stored in parts storage tapes wound around the respective tape reels in accordance with their forms and types, the fed chip parts are chucked by a plurality of suction nozzles, which are formed on the periphery of a rotary type index table, at predetermined suction positions, the index table is intermittently rotated so as to convey the chip parts to corresponding parts mounting positions on a printed board placed on an X-Y table, and the chip parts are automatically positioned/mounted at predetermined mounting positions on the printed board by moving the X-Y table in the X-Y directions. Apparatuses having such an arrangement have been developed and put into practical use.

An operation of such a conventional mounting apparatus is generally controlled by programs. In addition, in the above apparatus, when chip parts are mounted on a single printed board in a plurality of identical patterns by repeating the same pattern, and the same mounting operation is repeated in accordance with the same pattern formation direction.

For this reason, in the identical mounting patterns formed on the single printed board, the final parts mounting position of a given pattern and the initial mounting position of the next pattern may be greatly separated, and hence a considerably long period of time is required to move the X-Y table. In addition, since all the patterns formed on the printed board are oriented in the same direction, forming the patterns on the printed board is uniformly limited, and efficient patterning becomes impossible. Therefore, a large portion of a board material is wasted.

Recently, as various types of mounting patterns are produced in small quantities, various patterns tend to be formed in a single printed board. When a plurality of identical patterns and independent patterns having no correlation therewith are formed in a printed board by mounting various chip parts having different shapes and sizes together in this manner, since the above-described process in which the same pattern is repeatedly formed cannot be used, the identical patterns and the independent patterns are sorted, and positioning/mounting must be independently performed in units of sorted patterns, thereby extremely complicating the process.

In addition, when chip parts having different shapes and sizes are to be mounted on a single printed board together, if a large chip part or a chip part with a high center of gravity is mounted first, a positional error due to an inertial force tends occur because the frequency of movement of such a chip part upon high-speed movement of the X-Y table is higher than that of a small chip part or a chip part with a low center of gravity to be mounted next.

SUMMARY OF THE INVENTION

The present invention has been made to eliminate the drawbacks of the above-described conventional automatic electronic parts mounting apparatus. It is an object of present invention to efficiently perform parts mounting by changing the parts mounting sequence for each mounting pattern in accordance with the formation state of a mounting pattern. In order to achieve this object, according to the present invention, there is provided an automatic electronic parts mounting apparatus for mounting chip parts having different shapes and sizes repeatedly in a plurality of identical mounting patterns on a single printed board placed on an X-Y table which is moved at high speed in the X-Y directions, comprising a pattern storage means for storing NC (Numerical Control) data of the mounting patterns, a pattern position storage section for storing data representing positions on the board where the mounting patterns based on the NC data stored in the pattern storage means are formed, a sequence designating means, arranged in correspondence with the pattern position storage means, for designating a mounting sequence of the chip parts for the mounting patterns, a positioning unit for adjusting a positional relationship between a predetermined position and the chip part by moving the X-Y table at high speed when the chip part designated by the sequence designating means is mounted at the predetermined position on the board, and control means for controlling the positioning unit so as to mount the chip parts corresponding to the mounting patterns stored in the pattern storage section at predetermined positions stored in the pattern storage means in the sequence designated by the sequence designating means.

It is another object of the present invention to efficiently form a pattern on a board and eliminate waste of a board material by causing the pattern position storage means to store data representing a direction in which a mounting pattern based on the NC data is formed on the board.

It is still another object of the present invention to perform positioning/mounting without sorting the identical and independent patterns so as to increase the process speed by a simple, collective parts mounting process. In sequence to achieve this object, according to the present invention, there is provided an automatic electronic parts mounting apparatus for mounting chip parts having different shapes and sizes repeatedly in a plurality of patterns including identical mounting patterns and independent patterns having ano correlation therewith on a single printed board placed on an X-Y table which is moved at high speed in the X-Y directions, comprising a pattern storage means for storing NC data of both the identical and independent mounting patterns, a pattern position storage means for storing data representing positions and directions on the board in accordance with which both the identical and independent mounting patterns based on the NC data stored in the pattern storage means are formed, a sequence designating means, arranged in correspondence with the pattern position storage means, for designating a mounting sequence of the chip parts for both the identical and independent mounting patterns, a positioning unit for adjusting a positional relationship between a predetermined position and the chip part by moving the X-Y table at high speed when the chip part designated by the sequence designating means is mounted at the predetermined position on the board, and control means for controlling the positioning unit so as to mount the chip parts corresponding to both the identical and independent mounting patterns stored in the pattern storage means at predetermined positions stored in the pattern storage means in the sequence designated by the sequence designating means.

It is still another object of the present invention to prevent a positional error of a chip part due to an inertial force upon high-speed movement of the X-Y table and increase precision in mounting the chip parts by sorting/designating the chip parts as groups by the sequence designating means in a mounting sequence in which a positional error due to high-speed movement of the X-Y table is relatively smaller.

BRIEF DESCRIPTION OF THE DRAWINGS

FIG. 3 is a view illustrating a set state of NC data in the apparatus in FIG. 1;

DETAILED DESCRIPTION OF THE PREFERRED EMBODIMENTS

A parts feeding unit according to embodiments of the present invention will be described in detail below with reference to the accompanying drawings.

Figure 1:
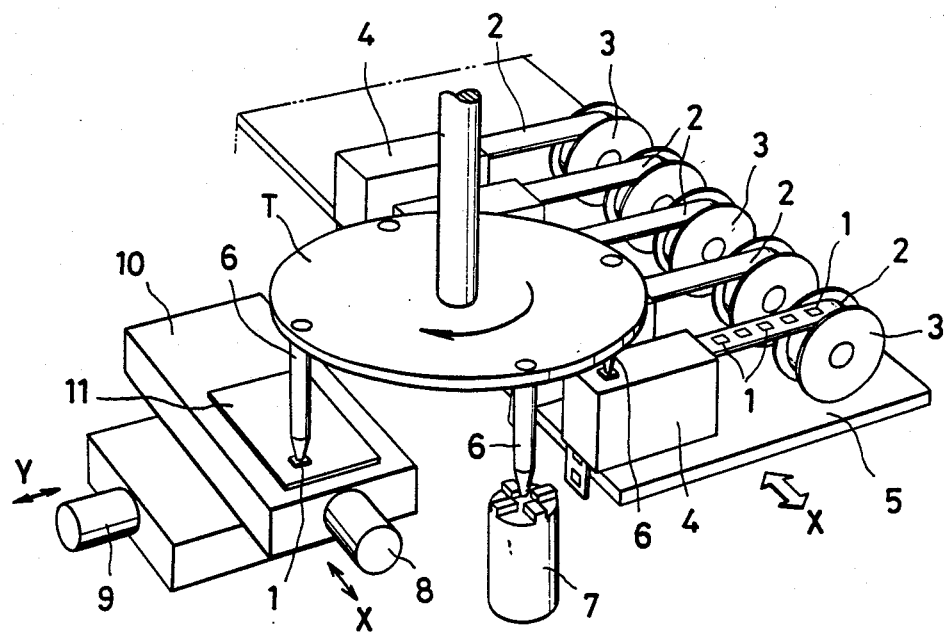
FIG. 1 is a schematic perspective view showing an overall arrangement of an automatic electronic parts mounting apparatus according to an embodiment of the present invention.

FIG. 1 is a perspective view showing an overall arrangement of an automatic electronic parts mounting apparatus according to the present invention. Reference numerals 1 denote chip parts which are stored in electronic parts storage tapes 2 at regular spaces. The electronic parts storage tapes 2 are wound around corresponding tape reels 3. The electronic parts storage tapes 2 are fed by a pitch from the tape reels 3 through convey units 4. The tape reels 3 and the convey units 4 are arranged on a tape moving table 5 which moves reciprocatively in the direction of X so as to constitute a parts feed means.

Referring to FIG. 1 reference symbol T denotes a turntable which is intermittently rotatable. Reference numerals 6 denotes suction nozzles arranged on the turntable T. Each suction nozzle 6 chucks one of the chip parts 1 from a corresponding electronic parts storage tape 2 selected in accordance with the moving state of the tape moving table 5 and conveys it onto a printed board placed on an X-Y table (to be described later) upon rotation of the turntable T.

In addition, reference numeral 7 denotes a positioning unit for correcting a positional error of the chip part 1 chucked by each suction nozzle in the X-Y directions and also for setting a mounting angle of the chip part; and 8 and 9, pulse motors for horizontally moving an X-Y table 10, on which a printed board 11 is placed, in the X-Y directions.

More specifically, after the chucked state of the chip part 1 chucked by the suction nozzle 6 is corrected by the positioning unit 7 and also the mounting angle is set, the chip part is conveyed above the X-Y table 10 upon intermittent rotation of the turntable T, and is mounted on the printed board 11 placed on the X-Y table 10. In addition, the mounting position of the chip part 1 to be mounted on the board 11 is adjusted by the horizontal movement of the X-Y table 10. Further, it may be possible that the angle setting of the chip part 1 is performed by rotating the suction nozzle 6 itself chucking the chip part 1, which is not shown in the drawings.

Figure 2:
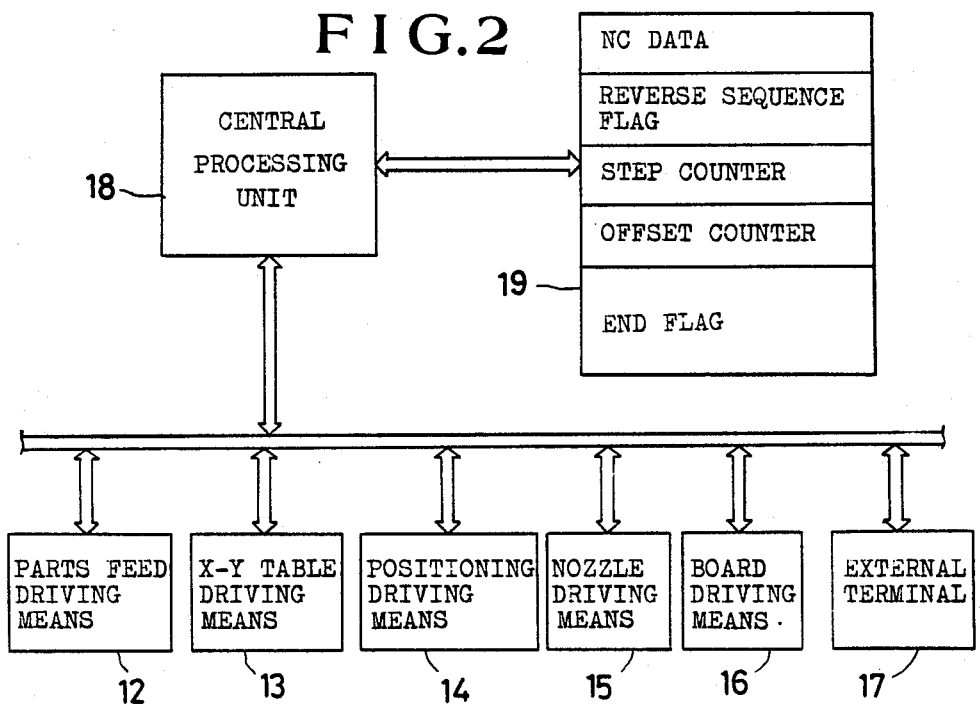
FIG. 2 is a block diagram showing a control section of the apparatus in FIG. 1.

FIG. 2 is a block diagram showing a control means of such an electronic part mounting apparatus. Reference numeral 12 denotes a parts feed driving means for moving the tape moving table 5 and driving the convey units 4; 13, a driving means for driving the pulse motors 8 and 9 of the X-Y table 10; 14, a positioning unit driving means for driving the positioning unit 7; 15, a nozzle driving means for controlling the intermittent rotation of the turntable T and suction operations of the suction nozzles 6; 16, a board convey means for setting/discharging the printed board 11 on/from the X-Y table 10; and 17, an external terminal for connecting a personal computer, a keyboard serving as an input unit for entering various data, or the like. The parts feed driving means 12 and the external terminal 17 are controlled by a central processing unit (to be referred to as a CPU hereinafter) 18.

In addition, reference numeral 19 denotes a memory means connected to the CPU 18. As shown in FIG. 3, the memory means 19 stores NC data consisting of mount data provided as parts mounting data such as step numbers, X-and Y-coordinates of parts mounting positions, mounting directions of chip parts, and types of parts, and offset data representing a position and a direction on a printed board at/in which a pattern is formed, and the parts mounting sequence of the pattern.

In this case, reference symbol F denotes the end of mount data of a repetitive pattern; P, a forward sequence in which the chip parts 1 are mounted in sequence on the board in the forward direction, Q, a reverse sequence in which the parts 1 are mounted in sequence on the board in the reverse direction, and E, the end of all the data. The memory section 19 comprises a step counter for indicating a designation address of mount data, an offset counter for indicating a designation address of offset data, a reverse sequence flag area in which a reverse sequence flag is set, and an end flag area in which an end flag is set.

An operation of such an electronic parts mounting apparatus will be described below with reference to a flow chart shown in FIG. 4.

After all the flags are reset, offset counter is set to the initial position. For example, in such a case as in FIG. 3, it is et to step No. 124. Subsequently, it is checked whether an initial offset command is p (forward sequence). If YES is obtained in this step, the step counter is set to 0, and the reverse sequence flag is cleared. If it is a reverse sequence, the step counter is set to a value obtained by incrementing the step number (M123 in the case of FIG. 3) showing the end of the repetitive pattern (see F) by one, and the reverse sequence flag is set.

In the forward sequence, while the step counter is incremented one by one, parts of corresponding mount data are sequentially mounted at predetermined positions. In the reverse sequence, while the step counter is decremented one by one, parts of corresponding mount data are sequentially mounted at predetermined positions.

Note that one-by-one parts mounting is performed in such a manner that each part represented by parts data is mounted at an X-Y corrdiante position represented by mounting position data of mount data designated by the step counter and in a rotational direction $\theta$ represented by mounting direction data by utilizing an X-Y coordinate position and a rotational direction $\theta$ of offset data designated by the offset counter as references.

More specifically, the moving table 5 is rotated in accordance with each parts data so as to allow the suction nozzle 6 to selectively chuck the chip part 1, positioning and direction setting of the chip part 1 are performed by the positioning unit 7, and the X-Y table 10 is actuated in accordance with mounting position data so as to move a parts mounting position on the printed board 11 to a position under the suction nozzle 6, thereby mounting the part.

When mounting for one pattern is completed, the content of the next offset command is checked. If it is a forward sequence as in the above case, the step counter is incremented and parts are sequentially mounted. If is a reverse sequence, the step counter is decremented and parts are sequentially mounted.

When the final parts mounting pattern is completed after such a mounting operation is repeatedly performed, an end command (E) is detected and the mount operation is ended.

Figures 5, 6:
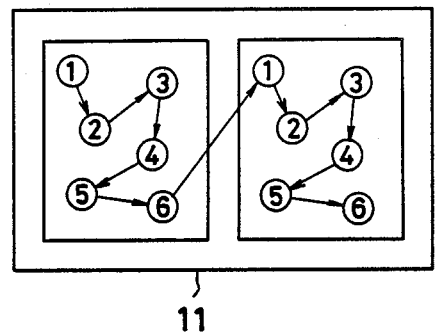
FIG. 5 is a view illustrating a mounting state of chip parts on a printed board and a mounting sequence in the apparatus in FIG. 1 according to a first embodiment.
FIG. 6 is a view illustrating an example of setting NC data in the apparatus in FIG. 1 according to the first embodiment.

In such a mounting apparatus, when electronic parts are mounted for two identical patterns on a printed board in accordance with a forward sequence as shown in, e.g., a first embodiment in FIG. 5, NC data shown in FIG. 6 is used.

Figures 7, 8:
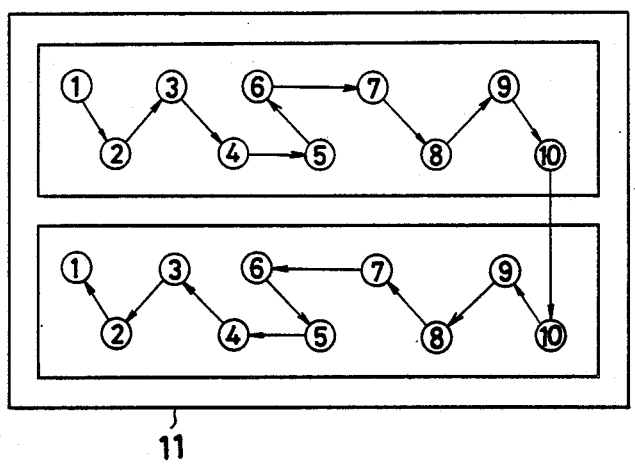
FIG. 7 is a view illustrating a mounting state of chip parts on a printed board and a mounting sequence in the apparatus in FIG. 1 according to a second embodiment.
FIG. 8 is a view illustrating an example of setting NC data in the apparatus in FIG. 1 according to the second embodiment.

In addition, when electronic parts are mounted on a printed board for two identical patterns in accordance with forward and reverse sequences as shown in a second embodiment in FIG. 7, NC data shown in FIG. 8 is used.

Figures 9, 10:
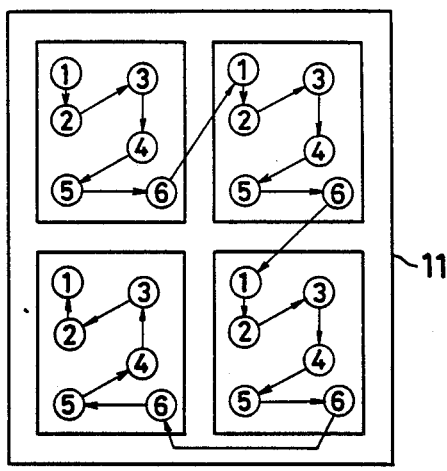
FIG. 9 is a view illustrating a mounting state of chip parts on a printed board and a mounting sequence in the apparatus in FIG. 1 according to a third embodiment.
FIG. 10 is a view illustrating an example of setting NC data in the apparatus in FIG. 1 according to the third embodiment.

Furthermore, when electronic parts are mounted on a printed board for four identical patterns in accordance with three forward sequences and one reverse sequence as shown in a third embodiment in FIG. 9, NC data shown in FIG. 10 is used.

Figures 11, 12:
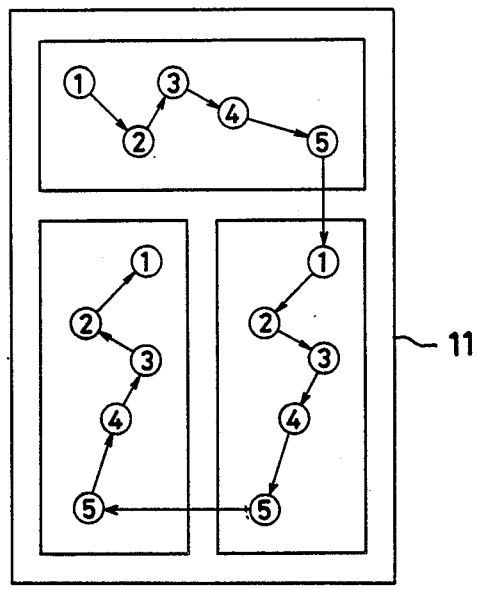
FIG. 11 is a view illustrating a mounting state of chip parts on a printed board and a mounting sequence in the apparatus in FIG. 1 according to a fourth embodiment.
FIG. 12 is a view illustrating an example of setting NC data in the apparatus in FIG. 1 according to the fourth embodiment.

Besides the above-described cases, when some patterns of a plurality of identical mounting patterns are formed by changing mounting directions as shown in, e.g., a fourth embodiment in FIG. 11, a predetermined inclination can be set in NC data by setting direction $\theta$ of corresponding offset data at a desired angle for example 90°, as shown in FIG. 12.

Figures 13, 14:
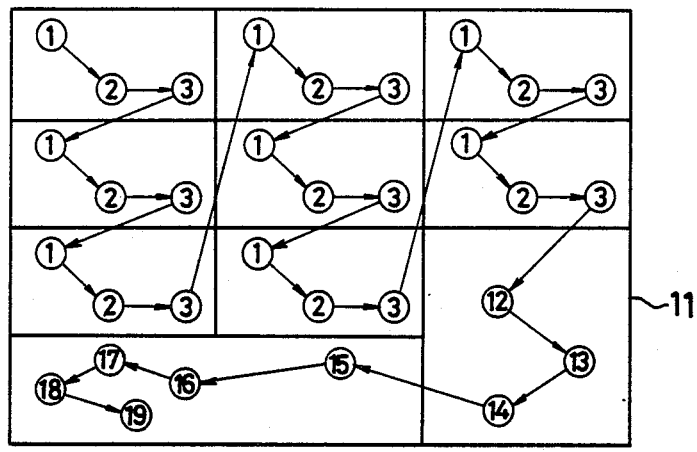
FIG. 13 is a view illustrating a mounting spate of chip parts on a printed board and a mounting sequence in the apparatus in FIG. 1 according to a fifth embodiment.
FIG. 14 is a view illustrating an example of setting NC data in the apparatus in FIG. 1 according to the fifth embodiment.

Moreover, when the chip parts 1 are mounted on the printed board 11 in a plurality of identical patterns and independent patterns having no correlation therewith as shown in a fifth embodiment in FIG. 13, NC data shown in FIG. 14 is used. In this case, the chip parts 1 are mounted for eight identical patterns in accordance with a forward sequence, and then the chip parts are mounted for two independent patterns which are different from each other.

Note that ①, ②, ③, ... in FIGS. 5, 7, 9, 11, and 13 represent the sequence of steps.

Figures 15, 16:
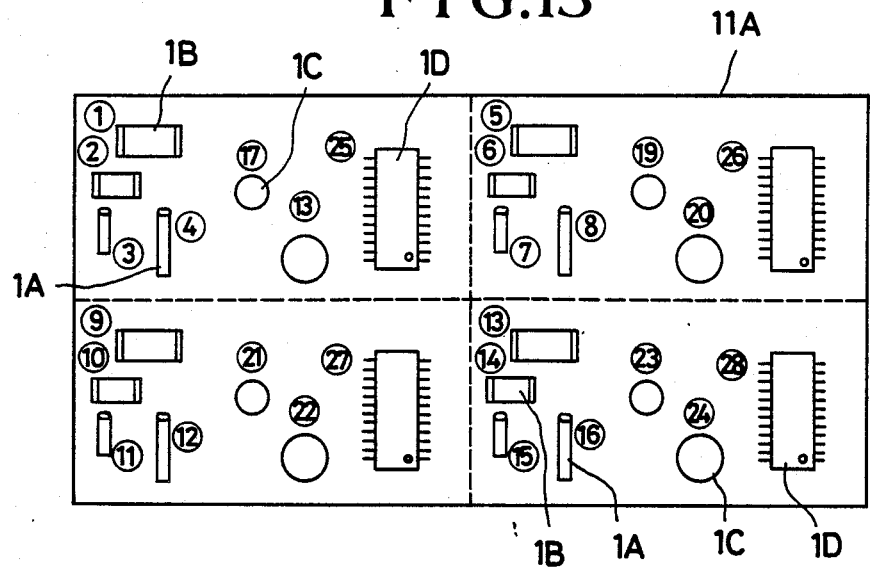
FIG. 15 is a schematic plan view showing a mounting state of electronic parts on a printed board according to another embodiment of the present invention.
FIG. 16 is a view illustrating an example of setting NC data in the apparatus in FIG. 1 according to a sixth embodiment.

FIG. 15 shows another embodiment of present invention. In this embodiment, the chip parts 1 are classified into three groups in accordance with their shapes and sizes, i.e., a group constituted by square chip parts 1B and cylindrical chip parts 1A, a group constituted by parts each having a relatively high center of gravity, e.g., electrolytic capacitors IC, and a group constituted by mini-flat packages ID each having a relatively large size. When the chip parts 1 are sequentially mounted to form four patterns in accordance with the sequence of the groups and a forward sequence, NC data shown in FIG. 16 is used.

Figure 4:
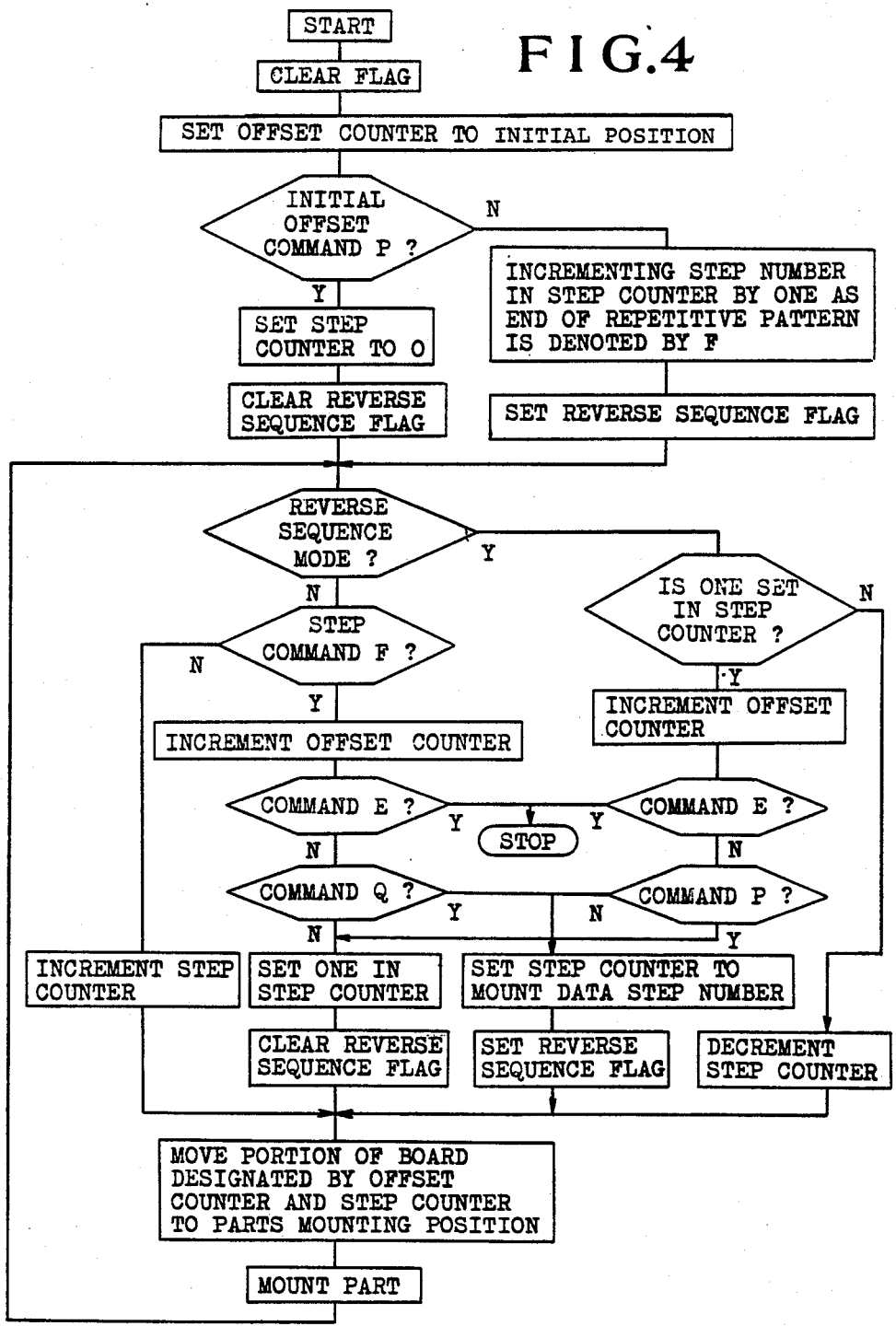
FIG. 4 is a flow chart showing a sequence of control for mounting chip parts in the apparatus in FIG. 1.

In this case, a control command "F" shown in FIG. 4 represents a repetitive pattern, and steps M1 to M7 indicate the contents of a mounting operation on a board 11A in accordance with a fundamental pattern. In addition, "1" prior to "F" represents the first group of divided patterns in repetitive mounting. Similarly, "1" represents the second group, and "F" represents the last group. "/" after "F" represents that the groups represented by "2" and "F" are different from each other. When "/" is not present, the group represented by "F" is included in the group represented by "2". Furthermore, steps M8 to M11 from "F" to "L" are offset values of pattern positions with respect to the first fundamental pattern, which represent that four patterns are formed on the board from M8 to M11. In this case, a control command "p" represents a forward sequence.

When such chip parts are to be mounted, the chip parts are sequentially mounted on the board 11A in units of sorted groups in a sequence in which they are relatively less subject to a positional error on the board 11A due to movement of the X-Y table 10. In FIG. 15, ①, ②, and ③ represent the mounting sequence of the parts. In this case, the CPU 18 controls the X-Y table driving section 13 on the basis of data associated with a movement speed which is stored in the memory section 19 such that the movement speed of the X-Y table 10 is increased when the square chip parts 1B and the cylindrical chip parts 1A are mounted, and is decreased when the electrolytic capacitors 1C having relatively high centers of gravity and mini-flat packages 1D having large sizes are mounted. For example, data associated with a speed stored in the memory section 19 are set in units of sorted groups.

In this embodiment, the chip parts are classified into three groups in accordance with their shapes and sizes, and the X-Y table 10 is moved at two speeds. However, the present invention is not limited to this arrangement. The parts may be classified into four groups in accordance with their shapes and sizes, and three or more movement speeds may be set.

The above-described NC data is updated by a keyboard (not shown) or a personal computer connected to the external terminal. Further, after the chip parts were mounted on the printed board 11, the printed board may be cut into pieces in units of patterns or may not be cut into pieces. It is optional selection.

Figures 17, 18:
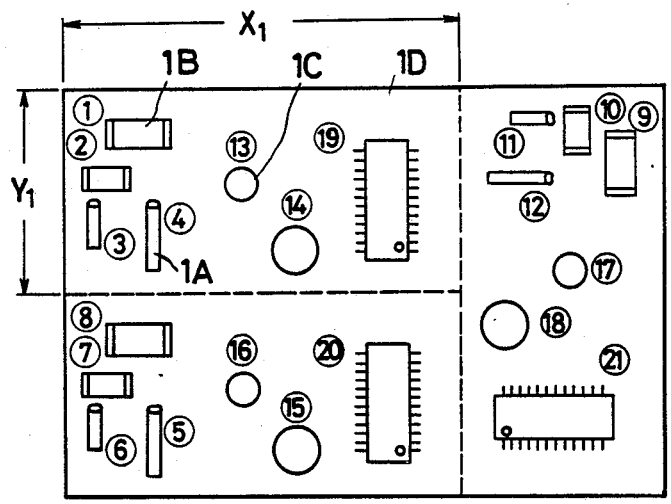
FIG. 17 is a schematic plan view showing a mounting state of electronic parts on a printed board according to furthermore another embodiment of the present invention.
FIG. 18 is a view illustrating a set state of NC data when chip parts are mounted on a printed board in a mounting sequence as shown in FIG. 17.

FIG. 17 shows furthermore another embodiment of the present invention. Similarly to the embodiment shown in FIG. 15, the chip parts 1 are classified into three groups in accordance with their shapes and sizes. In this embodiment, a group constituted by square chip parts 1B and cylindrical chip parts 1A is sequentially mounted on the printed board in accordance with a forward sequence, a reverse sequence and a forward sequence in the different direction of 90°. Secondly, a group constituted by electrolytic capacitors IC is sequentially mounted on the printed board in accordance with a forward sequence, a reverse sequence and a forward sequencer in the different direction of 90°. Finally, the mini-flat packages ID are sequentially mounted on the printed board in accordance with a forward sequence, a reverse sequence and a forward sequence in the different direction of 90°. In this case, NC data shown in FIG. 18 is used.

What is claimed is:

1. An automatic electronic parts mounting apparatus which has means for sucking chip parts having different shapes and sizes from a reciprocating tape moving table and for mounting the chip parts repeatedly in a plurality of identical mounting patterns on a single printed board placed on an X-Y table moving at high speed in the X-Y directions, the apparatus comprising:
    pattern storage means for storing, in mounting sequence, mounting data regarding kinds of chip parts in predetermined mounting patterns and positions on the printed board where the chip parts are mounted;
    pattern position storage means for storing data regarding positions on the printed board where the mounting patterns based on the mounting data stored in the pattern storage means are formed;
    sequence designating means arranged in correspondence with the pattern position storage means for designating a forward sequence where the chip parts in the mounting patterns are mounted in a forward direction in accordance with the mounting sequence of the pattern storage means, so as to constitute a forward mounting sequence, and a reverse sequence where the chip parts are mounted in a reverse direction in accordance with the mounting sequence of the pattern storage means so as to constitute a reverse mounting sequence; and
    means for moving the tape moving table so that the chip parts can be sucked in accordance with the mounting data in the pattern storage means, and for moving the X-Y table so that the chip parts can be repeatedly mounted at predetermined positions stored in the pattern position storage means in accordance with the sequence designated by the sequence designating means in the plurality of mounting patterns in the pattern storage means.

2. An apparatus as in claim 1, further comprising means for causing said pattern position storage means to store data regarding directions in which the mounting patterns based on the mounting data are formed on the printed board.

3. An apparatus as in claim 1, further comprising means for setting the mounting sequence of the chip parts based on a step number stored in the pattern storage means so that the chip parts are sorted and designated as groups in a sequence in which the chip parts are relatively less subject to a positional error due to high-speed movement of the X-Y table than would otherwise exist.

4. An automatic electronic parts mounting apparatus having means for sucking chip parts from a tape moving table and for carrying the sucked chip parts onto a printed board on an X-Y table so that the sucked chip parts are mounted at a position on the printed board which is indexed by horizontal movement of the X-Y table, the apparatus comprising:
    pattern storage means for storing, in correspondence with each step number, mounting data comprising parts data regarding kinds of chip parts and mounting positions data regarding relative mounting positions of the chip parts in successively mounting the plurality of chip parts on the printed board;
    pattern position storage means for storing, in the sequence of step numbers, offset data regarding formation positions of the parts mounting pattern on the printed board in forming the plurality of parts mounting patterns based on the mounting data stored in the pattern storage means on the printed board;
    sequence designating means for designating a forward sequence and a reverse sequence so as to constitute a forward mounting sequence and a reverse mounting sequence in accordance with the mounting sequence of the chip parts at the formation positions of the parts mounting patterns, the sequence designating means being established in correspondence with the step number of the pattern position storage means;
    an offset counter for designating the step number of the pattern position storage means;
    a step counter for designating the step number of the pattern storage means; and
    control means for controlling the tape moving table, the sucking means and the X-Y table on the basis of the offset data indicated by the offset counter and the mounting data indicated by the step counter so as to successively mount the chip parts on the printed board.

5. An apparatus as in claim 4, wherein the offset data stored in the pattern position storage means also designate formation directions of the mounting patterns based on the mounting data to the printed board.

6. An apparatus as in claim 5, wherein the mounting data stored in the pattern storage means also designate mounting directions of the chip parts.

7. An apparatus as in claim 4, wherein the mounting data stored in the pattern storage means also designate mounting directions of the chip parts.

8. An apparatus as in claim 4, further comprising step counter adding means for successively counting up the content of the step counter when the sequence of the sequence designating means designated by the offset counter is the forward sequence;

step counter subtracting means for successively counting down the content of the step counter when the sequence of the sequence designating means designated by the offset counter is the reverse sequence; and offset counter adding means for counting up the content of the offset counter every time designation of a series of mounting data in the pattern storage means from the step counter is brought to an end.

9. An automatic electronic parts mounting apparatus which has an intermittently rotatable turntable, a plurality of suction nozzles disposed on the peripheral edge of the turntable, a tape moving table and a plurality of parts feed units disposed in parallel on the tape moving table for sucking chip parts having different shapes and sizes from an optional unit on the reciprocating tape moving table and for mounting the chip parts repeatedly in a plurality of patterns including identical mounting patterns and independent patterns having no correlation therewith on a single printed board placed on an X-Y table moving at high speed in X-Y directions, the apparatus comprising:

pattern storage means for storing, in mounting sequence, mounting data regarding kinds of chip parts in both the predetermined mounting patterns and positions on the printed board where the chip parts are mounted;

pattern position storage means for storing data regarding positions on the board where both the mounting patterns based on the mounting data stored in the pattern storage means are formed, and regarding directions thereof;

sequence designating means arranged in correspondence with the pattern position storage means for designating a forward sequence where the chip parts in the mounting patterns are mounted in a forward direction in accordance with the mounting sequence in the pattern storage means, so as to constitute a forward mounting sequence, and a reverse sequence where the chip parts are mounted in a reverse direction in accordance with the mounting sequence of the pattern storage means so as to constitute a reverse mounting sequence; and means for moving the tape moving table so that the chip parts can be sucked by the suction nozzles on the basis of the mounting data in the pattern storage means, and for moving the X-Y table so that the chip parts can be repeatedly mounted at predetermined positions stored in the pattern position storage means in accordance with the forward or reverse sequence designated in the sequence designating means in the plurality of both mounting patterns in the pattern storage means.

* * * * *